United States Patent [19]

Morimoto et al.

[11] Patent Number: 4,565,741
[45] Date of Patent: Jan. 21, 1986

[54] BORON NITRIDE FILM AND PROCESS FOR PREPARING SAME

[75] Inventors: Kiyoshi Morimoto, Mobara; Toshinori Takagi, Nagaokakyo, both of Japan

[73] Assignee: Futaba Denshi Kogyo K.K., Mobara, Japan

[21] Appl. No.: 584,403

[22] Filed: Feb. 28, 1984

[30] Foreign Application Priority Data

Feb. 28, 1983 [JP] Japan .................................. 58-30792

[51] Int. Cl.[4] .......................... B32B 9/00; B32B 17/06; B32B 19/00
[52] U.S. Cl. .................................... 428/427; 428/698; 428/699; 428/701; 427/255.2
[58] Field of Search ............... 428/698, 699, 700, 427, 428/701; 427/255.2

[56] References Cited

U.S. PATENT DOCUMENTS

| 3,063,858 | 11/1962 | Steeves | 428/698 X |
| 3,564,565 | 2/1971 | Haberecht et al. | 428/698 X |
| 3,692,566 | 9/1972 | Branovich et al. | 427/255.2 X |
| 3,922,475 | 11/1975 | Manasevit | 428/700 |
| 4,066,527 | 1/1978 | Takagi et al. | 204/192 |
| 4,072,797 | 2/1978 | Gass et al. | 428/698 X |
| 4,096,297 | 6/1978 | Pappis et al. | 428/698 X |
| 4,120,700 | 10/1978 | Morimoto | 148/1.5 |
| 4,152,478 | 5/1979 | Takagi | 428/221 |
| 4,227,961 | 10/1980 | Takagi | 156/608 |
| 4,233,613 | 11/1980 | Morimoto | 357/16 |

Primary Examiner—George F. Lesmes
Assistant Examiner—Nancy A. B. Swisher
Attorney, Agent, or Firm—Oblon, Fisher, Spivak, McClelland & Maier

[57] ABSTRACT

A boron nitride (BN) film is disclosed having excellent electrical insulating and heat conduction characteristics and capable of acting as seeds for epitaxially growing a semiconductor film thereon which has a crystallizability sufficient to incorporate a semiconductor element therein. The BN film is formed by the growth on a substrate in a manner to be preferentially orientated to a predetermined axis thereof. A process for preparing such film is also disclosed.

2 Claims, 10 Drawing Figures

BORON NITRIDE FILM AND PROCESS FOR PREPARING SAME

BACKGROUND OF THE INVENTION

1. Field of the Invention

This invention relates to a boron nitride film and a process for preparing the same, and more particularly to a boron nitride film of excellent electrical insulating and heat conduction characteristics formed on a substrate in a manner to be preferentially oriented to a predetermined axis thereof which is suitable for use as an intermediate insulating layer in a three-dimensional semiconductor device to allow semiconductor layers each having a semiconductor element incorporated thereinto to be three-dimensionally laminated to accomplish the high density packaging of the semiconductor device or as an intermediate insulating layer in a semiconductor device for large power.

2. Description of the Prior Art

Recently, researches have been made in the three-dimensional packaging of a semiconductor device wherein semiconductor chips and/or layers are superposed to form one semiconductor element, with the high integration of a semiconductor element. However, it is required to solve various problems resulting from the structural features of a semiconductor in order to realize such three-dimensional packaging.

One of the problems is that it is difficult to form, on an intermediate insulating layer insulating interlayer a semiconductor device, a semiconductor layer having a crystallizability sufficient to incorporate a semiconductor element therein. When an insulating layer has been deposited on a semiconductor base plate of which the surface has roughness formed thereon due to a semiconductor element which has been already incorporated into the semiconductor base plate, it is impossible to grow a semiconductor layer of a good crystallizability on the insulating layer because the surface of the insulating layer exhibits an irregular state.

Another important problem is how to attain insulation between semiconductor layers of a semiconductor device and how to improve heat dissipation of the device. An electrical insulator is generally inferior in heat conduction characteristics, and electrical insulating properties and heat dissipation characteristics are contrary to each other. Thus, if both electrical insulating properties and heat dissipation characteristics of a semiconductor device are improved giving cheerful consideration to the selection of materials, the manufacturing of a semiconductor device and the like, the high integration and high density packaging of a semiconductor device can be significantly promoted.

The inventors proposed a beryllium oxide (BeO) and a method of preparing the same, and a semiconductor device using the BeO film in view of the foregoing problems of the prior art while taking notice of the fact that the use of a BeO film having excellent electric insulating properties and heat conduction characteristics as an insulating layer between semiconductor layers of a semiconductor device and the growth of at least one of the semiconductor layers on the BeO film allow the semiconductor layer to have a crystallizability sufficient to incorporate a semiconductor element thereinto. However, the prior art is often encountered with difficulty in the formation of such BeO film.

Now, attention is paid to boron nitride (hereinafter referred to as "BN") in view of the fact that it has the most excellent electrical insulating properties and heat conduction characteristics next to BeO. A BN film has been conventionally formed on a semiconductor layer according to a chemical vacuum deposition (CVD) process or a sputtering process. However, all the so-formed BN films are amorphous. Although, the film has a thermal conductivity substantially equal to stainless steel, it makes the epitaxial growth of a semiconductor layer thereon having a crystallizability sufficient to incorporate a semiconductor element thereinto substantially impossible.

The present invention has been made in view of the foregoing disadvantages of the prior art.

Accordingly, it is an object of the present invention to provide a BN film of excellent electrical insulating properties and heat conduction characteristics which is capable of exhibiting thermal conductivity about three times as much as the conventional amorphous BN film, and acting as an orientation film utilized as seeds for epitaxially growing a semiconductor layer thereon even if the BN film has been formed on an amorphous substrate or a substrate having roughness formed thereon.

It is another object of the present invention to provide a BN film which is capable of being used as an insulating layer between semiconductor layers of a three-dimensional semiconductor device to significantly promote the high integration and high density packaging of the device.

It is a further object of the present invention to provide a BN film which is capable of being used as an insulating layer between a heat dissipation plate and a semiconductor layer in a semiconductor device for large power to provide the device with excellent heat dissipation characteristics while keeping high electrical insulating properties.

It is still a further object of the present invention to provide a process for preparing a BN film having such excellent advantages as described above.

In accordance with the present invention, there is provided a boron nitride film grown on the surface of a substrate in a manner to be preferentially orientated to a predetermined axis thereof. In accordance with another aspect of the present invention, there is provided a process for preparing a boron nitride film comprising the steps of heating boride charged in a closed-type crucible having at least one injection nozzle to form boron vapor; ejecting said boron vapor through said nozzle into a nitrogen atmosphere having a pressure below $10^{-2}$ Torr and ionizing at least a part thereof; and impinging said ionized boron vapor on the surface of a substrate together with nitrogen to form a boron nitride film on said substrate.

BRIEF DESCRIPTION OF THE DRAWINGS

Other objects and many of the attendant advantages of the present invention will be readily appreciated as the same becomes better understood by reference to the following detailed description when considered in connection with the accompanying drawings, wherein.

DETAILED DESCRIPTION OF THE PREFERRED EMBODIMENTS

Now, the present invention will be described hereinafter by way of example with reference to the accompanying drawings.

First, an example of an apparatus will be described with reference to FIG. 1 which is adapted to prepare a BN film of the present invention according to an ionized cluster beam deposition process (hereinafter referred to as "ICB") process.

Figure 1:
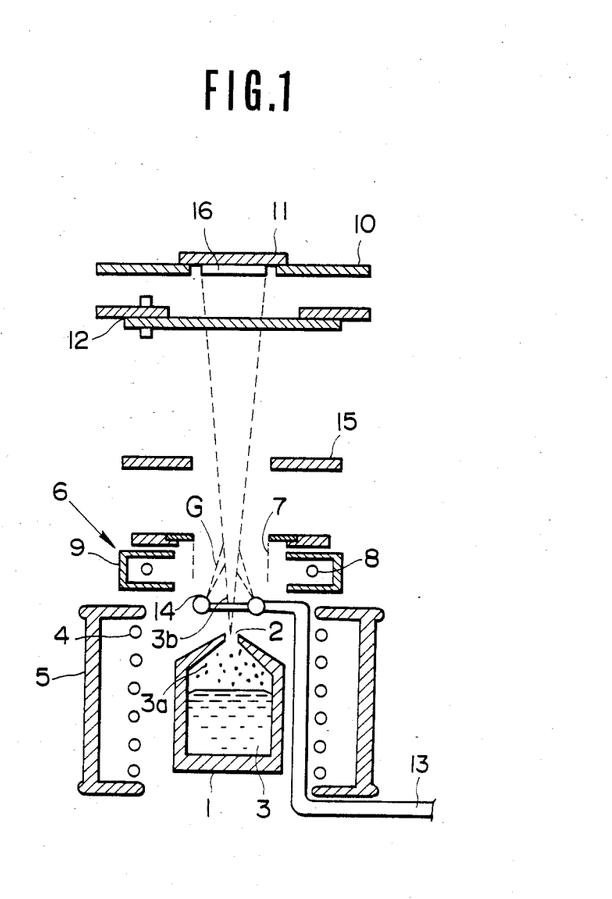
FIG. 1 is a schematic view showing one example of an apparatus suitable for use in the preparation of a BN film according to the present invention.

The apparatus shown in FIG. 1 includes a closed-type crucible 1 having at least one injection nozzle 2 of about 0.5 to 2.0 mm in diameter formed at the upper portion thereof. The nozzle 2 is desirably formed to have an aspect ratio less than 1 by rendering the dimension along the axial direction thereof smaller than the diameter. The crucible 1 is charged with boron oxide ($B_2O_3$) 3 in the form of powder, flake or pellet.

The apparatus also includes a heating device 4 provided around the crucible 1. In the example illustrated in FIG. 1, the heating device 4 is the electron impact type which comprises a coil filament arranged around the crucible 1 and adapted to emit electrons when heated, and a power source (not shown) for applying positive potential to the crucible 1 to accelerate electrons emitted from the filament, so that electrons are permitted to impinge on the outer surface of the crucible 1 to heat it.

Alternatively, the crucible 1 may be heated by resistance heating, radiation heating or a combination thereof. The resistance heating is applicable when the crucible 1 is formed by a conductive material, and is carried out by providing the upper and lower portions of the crucible 1 with specific terminals and flowing a large current into the crucible via the terminals under a low voltage, to thereby heat the entire crucible 1. The radiation heating is attained by arranging a heater around the crucible 1 to heat it.

In addition, the apparatus includes a heat shielding plate 5 and an ionization chamber 6. The ionization chamber 6 comprises a mesh-like anode 7 formed into a cylindrical shape, a rectangular cylindrical shape or a parallel-plate shape so as to surround a path for $B_2O_3$ vapor described hereinafter and an electron emitting filament 8 and a shield plate 9 which are arranged around the anode 7.

Further, the apparatus includes a holder 10 for holding thereon a substrate 11 on which a BN film is to be deposited and a shutter 12 serving to prevent the impingement of boron (B) or oxygen (O) onto the substrate 11 when the impingement is not desired. The substrate 11 may be a monocrystalline semiconductor substrate such as, for example, monocrystalline silicon, a metal substrate, an amorphous insulating substrate such as a glass substrate, or the like, as desired.

Reference numeral 13 designates a gas supply pipe provided with at least one nozzle 14. In the illustrated example, the pipe 13 is disposed to allow the nozzle 14 to be arranged in proximity to the injection nozzle 2 of the crucible 1. Alternatively, it may be provided in a manner to position the nozzle 14 adjacent to the substrate 11.

Between the substrate 11 and the ionization chamber 6, an acceleration electrode 15 may be arranged as desired. The acceleration electrode 15 is applied thereto potential negative with respect to the crucible 1 from a power source (not shown) to accelerate $B_2O_3$ vapor ionized in a manner as described hereinafter.

Furthermore, the apparatus may have a heating means (not shown) arranged adjacent to the substrate 11 as required which acts to heat the substrate.

The apparatus constructed as described above is received in a vacuum casing (not shown) and supported therein by a suitable support means. The vacuum casing is connected to an evacuation apparatus (not shown) so that a high vacuum atmosphere of $10^{-6}$ Torr or less is formed therein. The vacuum casing is also adapted to have a reactive gas G such as forming gas introduced therein through the gas supply pipe 13. The forming gas introduced in the casing may be, for example, a mixed gas consisting of 90 parts of nitrogen gas and 10 parts of hydrogen gas.

Now, a BN film of the present invention will be described which is prepared using the apparatus described above.

First, the crucible 1 is charged with boron oxide ($B_2O_3$) 3 formed into a suitable shape and the vacuum casing is evacuated to a pressure of $10^{-6}$ Torr or less. Then, a mixture G of nitrogen gas and hydrogen gas mixed with a ratio of 90:10 is introduced in the vacuum casing through the gas supply pipe 13 to keep it at a pressure below $10^{-2}$ Torr, preferably as low as $3.5 \times 10^{-4}$ Torr.

Then, the heating device 4 is actuated to heat boron oxide 3 in the crucible at a temperature between 1350° C. and 1450° C. to form vapor 3a of the boron oxide, which is ejected through the injection nozzle 2 of the crucible 1 to the exterior of the crucible 1 having a nitrogen atmosphere due to the difference in pressure between the interior and exterior of the crucible.

The ejected vapor 3a has kinetic energy imparted thereto which corresponds to its injection velocity, to thereby form a vapor stream 3b flowing toward the substrate and vapor-like boron (B) forms clusters comprising a large aggregate of boron atoms loosely coupled together by van der Waals forces by utilizing a supercooled state attained due to the adiabatic expansion at the time of the ejection from the nozzle. The formation of such clusters contributes to an improvement in the ionization efficiency in the ionization chamber 6 and the formation of a BN film 16 of high quality on the substrate 11.

The vapor stream 3b having kinetic energy imparted thereto as described above enters the ionization chamber 6, in which at least a part of the vapor is ionized. More particularly, in the ionization chamber 6, electrons emitted from the filament 8 heated to a high temperature are accelerated by voltage of 100 to 1000 V applied between the filament 8 and the meshy anode 7 to impinge on the vapor stream 3b to allow at least a part of the vapor to be ionized. In this instance, when the vapor stream 3b ejected from the nozzle 2 forms clusters, one of atoms forming the cluster is ionized due to the impingement of electrons thereon to form a cluster ion. Also, a part of the mixed gas G ejected from the nozzle 14 reaches the ionization chamber to be ionized therein due to electron impingement.

The ionized clusters are transported toward the substrate 11 together with neutral clusters and the mixed gas G introduced in the path of clusters, and are permitted to impinge on the surface of the substrate 11 when the shutter 12 is opened, so that the clusters are separated into the individual atoms due to a surface migration effect to allow the atoms to diffuse on the surface of the substrate, to thereby form a BN film 16 on the substrate 11. After such deposition, the BN film 16 thus formed is subjected to annealing at a temperature of about 350° C. in a vacuum atmosphere for 1 hour to remove moisture from the BN film 16 which is formed by a reaction of hydrogen contained in the mixed gas G with oxygen of the boron oxide.

The vapor stream 3b impinging on the substrate 11, as described above, is ionized at least partially while it passes through the ionization chamber 6, and the electrical field of the ion effectively acts on the initial stage of the film formation on the substrate 11. More specifically, the electrical field of the ion promotes the formation of seeds of crystal growth and further effectively acts on the coalescence of atoms into an island region about the so-formed seeds. In addition, such ionization has another effect of promoting the reaction between B and N to allow the formation of a BN film having a stoichemical composition and a good crystallizability.

Further, the vapor stream 3b is adapted to impinge on the substrate 11 with kinetic energy imparted thereto at the time of the ejection. Thus, the formed BN film 16 has an excellent quality, because such incident energy contributes to the formation of a BN film which has a good adhesion with respect to the substrate 11, the increase in packing density of the BN film and the improvement in crystallizability of the BN film. This is for the reason that the film 16 is preferentially orientated to a predetermined axis thereof or the C-axis even if the substrate 11 has roughness somewhat formed on the surface thereof or exhibits an amorphous property, and when the substrate 11 is monocrystalline, the epitaxial growth of BN is accomplished on the substrate 11 to form the film 16 of a monocrystal regulated by the crystallographic axis of the substrate 11.

Furthermore, the adjustment of acceleration voltage applied to the anode 7 to vary an ionization current derived from the filament 8 allows the degree of ionization of the vapor stream 3b to be controlled, so that the BN film 16 deposited on the substrate 11 may be further controlled in various properties such as crystallizability.

The embodiment illustrated, as described above, is adapted to eject the vapor 3a to the exterior of the crucible 1 utilizing the difference in pressure between the interior and exterior of the crucible to impart kinetic energy to the vapor 3a. However, the vapor stream 3b may be accelerated by electrical field after at least a part thereof is ionized, so that additional kinetic energy may be imparted to the vapor stream 3b to further carry out the control and/or improvement of crystallizability of the BN film 16.

More particularly, the application of voltage negative with respect to the crucible 1, for example, the application of acceleration voltage of about 0 to 10 kV to the acceleration electrode 15 accelerates particles of the vapor stream 3b ionized during the passing through the ionization chamber to permit kinetic energy to be imparted to the ionized particle, so that the energy may effectively act to improve and/or control the crystallizability of the film 16 at the time of the deposition to contribute to the formation of the film 16 having a further excellent quality. In particular, such construction, when a monocrystalline substrate such as a silicon monocrystalline substrate is used as the substrate 11, exhibits an excellent advantage of effectively controlling crystallizability of the BN film 16 by varying acceleration voltage to be applied to the acceleration electrode 15 in view of the relationship with the crystal face of the substrate 11. Also, it is a matter of course that the energy applied to the particles ionized by the electrical field effectively serves to improve adhesion of the film with respect to the substrate 11.

Alternatively, when the holder 10 is formed of a conductive material, such acceleration voltage may be applied between the holder 10 and the crucible 1 without independently providing the acceleration electrode 15.

The BN film formed in the manner as described above is adapted to effectively act as an intermediate insulating layer on insulating interlayer in a semiconductor device of a three-dimensional structure. Some semiconductor devices into which a BN film of the present invention is incorporated in various manners to act as an insulating interlayer will be described with reference to FIGS. 2 to 7.

Figure 2:
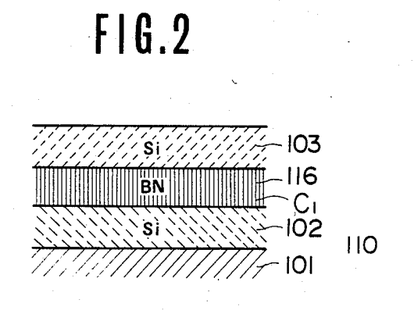
FIGS. 2 to 7 are schematic sectional views respectively showing first to sixth semiconductor devices in each of which a BN film is used as an intermediate insulating layer.

FIG. 2 shows a first semiconductor device of such type, which is formed as described hereinafter. First, a monocrystalline semiconductor such as a monocrystalline Si, GaP, GaAs or the like is deposited on an insulating substrate 101 to form a lower semiconductor layer 102. Then, a semiconductor element is incorporated into the lower semiconductor layer 102 utilizing conventional semiconductor element forming techniques widely known in the art to form a base 110, which is mounted on the holder 10 of the apparatus shown in FIG. 1.

Then, a BN film 116 acting as an insulating layer is deposited on the lower semiconductor layer 102 according to the ICB process using the apparatus of FIG. 1 operated under the deposition conditions that acceleration voltage Va applied to the acceleration electrode 15 and electronic current Ie for ionization are set at 0.5 kV and 100 mA, respectively. The BN film 116, as described above, is grown in a manner such that the crystallographic axis $C_1$ is preferentially orientated to the C-axis, even when a semiconductor element is incorporated into the surface portion of the lower semiconductor layer 102 to the degree sufficient to lose the flatness of the surface. Thus, a three-dimensional film semiconductor device of the multilayer type can be prepared by epitaxially growing an upper semiconductor layer 103 of a monocrystal on the BN film 116 according to an ion beam depositing process utilizing such orientation of the BN film and then incorporating a semiconductor element into the upper semiconductor layer 103.

Alternatively, the semiconductor device shown in FIG. 2 may be prepared in a manner such that a material such as a rock salt which is easy to dissolve in a solvent such as water and form a cleavage plane is used as a material for a substrate 101. A lower semiconductor layer 102, a BN film 116 and an upper semiconductor layer 103 are then deposited on the base plate 101 in order according to a suitable procedure such as an ion beam depositing process, an ICB process or the like and the base plate 101 is dissolved to expose the lower surface of the lower semiconductor layer 102 through which a semiconductor element is to be incorporated into the layer 102. In this instance, the BN film 116 is formed as a monocrystalline film because it is regulated by the crystallographic axis of the lower semiconductor layer 102 to be epitaxially grown.

Also, in the first semiconductor device of FIG. 2, the upper semiconductor layer 103 is formed by growing a monocrystalline film of Si. Alternatively, the layer 103 may be formed of GaAs, GaSb, GaP, InSb or the like.

Figure 3:
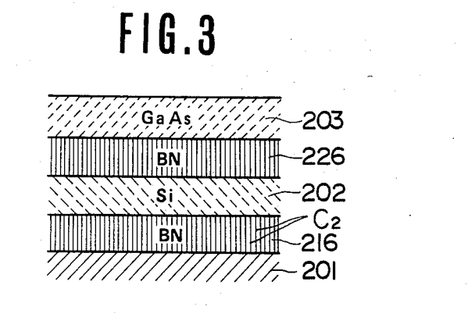

A second semiconductor device in which a BN film according to the present invention is used as an intermediate insulating layer is shown in FIG. 3, which is prepared by first depositing a first BN film 216 acting as an insulating layer on a substrate 201 of an amorphous material such as glass, ceramic or the like according to the ICB process under the same deposition conditions as the first semiconductor device, as shown in FIG. 3, wherein the crystallographic axis $C_2$ of the BN film 216 is preferentially orientated along the C-axis (002) Then, on the first BN film 216 is deposited a lower semiconductor layer 202 of monocrystalline Si according to the ICB process which is regulated by the crystallographic axis of the BN film 216 to be epitaxially grown. Subsequently, a second BN film 226 is formed on the upper surface of the lower semiconductor layer 202 which is regulated by the crystallographic axis of the lower semiconductor layer 202, and then an upper semiconductor layer 203 of, for example, monocrystalline GaAs is deposited on the second BN film 226, according to the ICB process, which is regulated by the crystallographic axis of the film 226 to be epitaxially grown.

Thus, it should be noted that the second semiconductor device has an advantage that a desired material may be used for the base plate 201 irrespective of its insulating properties or conductivity.

Figure 4:
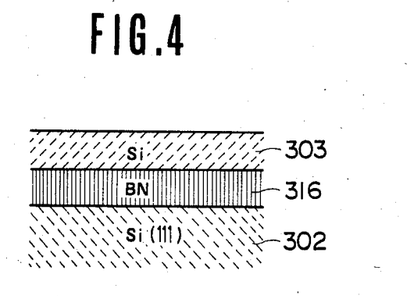

FIG. 4 shows a third semiconductor device having a BN film of the present invention used therein as an insulating layer. The semiconductor device comprises a lower semiconductor layer 302 formed of a monocrystalline Si semiconductor wafer, a BN film 316 acting as an insulating layer which is deposited on the (111) plane of the monocrystalline Si in the substantially same manner as the first and second semiconductor devices, and an upper semiconductor layer 303 of a Si film deposited on the upper surface of the BN film 316 which is regulated by the crystallographic axis of the BN film 316 to be epitaxially grown.

Figure 5:
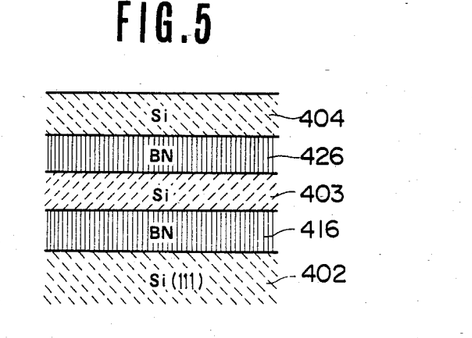

FIG. 5 shows a fourth semiconductor device wherein a BN film according to the present invention is interposed as an insulating layer between semiconductor layers. The semiconductor device of FIG. 5 is prepared in the following manner. First, a lower semiconductor layer 402 is formed of a monocrystalline Si semiconductor wafer in the substantially same manner as the device shown in FIG. 4, the layer 402 acting as a substrate. Then, a first BN film 416 serving as an insulating layer is deposited on the lower semiconductor layer 402 in a manner such that it is regulated by the crystallographic axis of the lower semiconductor layer 402. On the first BN film 416 is then formed a first upper semiconductor layer 403 of a Si film due to epitaxial growth, on which a second BN film 426 also acting as an insulating layer is deposited falling under the regulation of crystallographic axis of the first upper semiconductor layer 403. Finally, a second upper semiconductor layer 404 is deposited on the second BN film 426 which is regulated by the crystallographic axis of the second BN film 426 to be epitaxially grown.

It will be noted that the semiconductor device shown in FIG. 5 is adapted to substantially improve the integration to a level sufficient to carry out the high density packaging because there are provided three monocrystalline semiconductor layers into each of which a semiconductor element is adapted to be incorporated. Also, the semiconductor device has an advantage that because the BN films 416 and 426 each are effectively preferentially orientated to the C-axis even with respect to a semiconductor layer having roughness somewhat formed on the surface thereof due to the incorporation of a semiconductor element thereinto, the formation or incorporation of a semiconductor element may be carried out with respect to either surface of each semiconductor layer 403 or 404.

Figure 6:
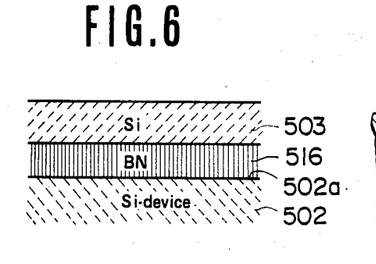

FIG. 6 shows a fifth semiconductor device including a BN film of the present invention acting as an insulating layer, which has been prepared in view of the foregoing. More particularly, in the device, a Si device such as an integrated circuit or the like is incorporated into the upper surface side 502a of a monocrystalline Si semiconductor wafer to form a lower semiconductor layer 502, and a BN film 516 of the present invention is deposited on the lower semiconductor layer 502 in such a manner as described above. Further, on the BN film 516 is deposited an upper semiconductor layer 503 of a monocrystalline Si. It is of course that in the device an integrated circuit or the like may be incorporated into the upper semiconductor layer 503.

The high integration of a semiconductor integrated circuit in recent years requires to give a careful consideration to an improvement in heat dissipation of semiconductor devices such as a semiconductor element for large power, for example, a power transistor, a linear integrated circuit for an audio equipment and the like. Such an improvement in heat dissipation characteristics of a semiconductor device renders a further increase in integration of the device possible.

Figure 7:
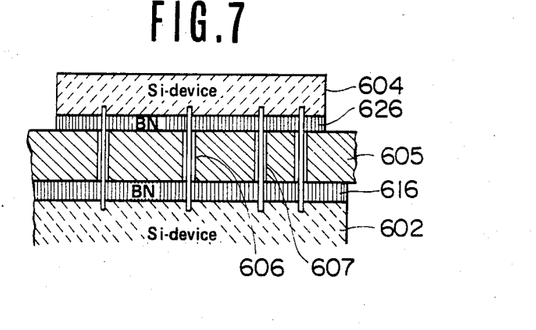

FIG. 7 illustrates a sixth semiconductor device having a BN film of the present invention provided therein, which has been prepared in view of the foregoing while taking notice of the fact that the heat dissipation characteristics of a semiconductor device which is highly integrated and packaged with high density can be significantly improved by depositing a metallic film for heat dissipation such as an Al film on a BN film of the present invention to more effectively improve an excellent heat conductivity of the BN film to efficiently discharge heat through the metallic film to the exterior or carry out shielding between multi-layer elements by means of the metallic film, depositing a second BN film of the present invention on the metallic film, and forming another semiconductor layer on the second BN film.

More particularly, the semiconductor device of FIG. 7 comprises a lower semiconductor layer 602 having a semiconductor element incorporated thereinto in the substantially same manner as the device of FIG. 6, a first BN film 616 deposited on the lower semiconductor layer 602 to act as an insulating layer, a heat dissipation plate 605 of a metallic or magnetic material deposited on the first BN film 616, a second BN film 626 deposited on the heat dissipation plate 605 to act as an insulating layer, and an upper semiconductor layer 604 formed on the second BN film 626. The upper semiconductor layer 604 is formed therein with an integrated circuit or the like, and the electrical connection between the upper and lower semiconductor layers 604 and 602 is carried out by means of wirings 607 inserted through small through-holes 606 formed at the heat dissipation plate 605.

In the semiconductor device of FIG. 7, the crystalline BN films 616 and 626 have not only excellent heat conduction characteristics but an anisotropy in heat conduction characteristics. The thermal conductivity of each BN film in the direction parallel to the crystallographic axis is about three times as much as that in the perpendicular to the axis, so that the semiconductor device may exhibit an effect of enhancing heat dissipation from the upper and lower semiconductor layers 604 and 602 to the heat dissipation plate 605. This results in a semiconductor device for large power such as a power transistor or a semiconductor device packaged with high density which is provided therein with such crystalline BN film acting as an insulating layer carrying out heat dissipation with good efficiency. In this instance, the formation of heat dissipation plate 605 by a metallic material exhibits an electrostatic shielding effect, whereas that by a magnetic material provides a magnetic shielding effect.

In each of the semiconductor devices described above, it is most convenient that the formation of BN film or semiconductor layer of good quality is carried out according to the ICB process proposed by the inventors. The ICB process effectively exhibits a surface migration effect that clusters separate into individual atoms upon impingement on a substrate to diffuse on the surface of the substrate, an effect of effectively acting on the formation or coalescence of seeds of crystal growth at the initial stage at which ions contained in clusters or atoms form a film, a surface cleaning effect due to kinetic energy imparted to a vapor stream, an ion implantation effect and the like, resulting in a film being formed which has good quality, high adhesion to a substrate and a good flatness from the viewpoint of crystallography. Also, the ICB process has a high degree of freedom with respect to film deposition conditions such as, for example, the difference in pressure between the interior and exterior of a crucible, ionization in an ionization chamber and a degree of such ionization, an electrical field for acceleration and the like, so that the control of crystal structure of a film to be formed may be facilitated to permit a monocrystalline film of good quality to be prepared depending upon desired characteristics.

Also, in the devices shown in FIGS. 2 to 7, a temperature of the substrate at the time of forming the BN film can be set as desired between a room temperature and 500° to 600° C. Thus, there is no fear of causing impurity concentration of the semiconductor element which has been already incorporated in the semiconductor layer to be inbalanced. This is helpful to form a three-dimensional semiconductor device.

Now, results of experiments on a BN film according to the present invention will be described with reference to FIGS. 8 to 10.

Figure 8:
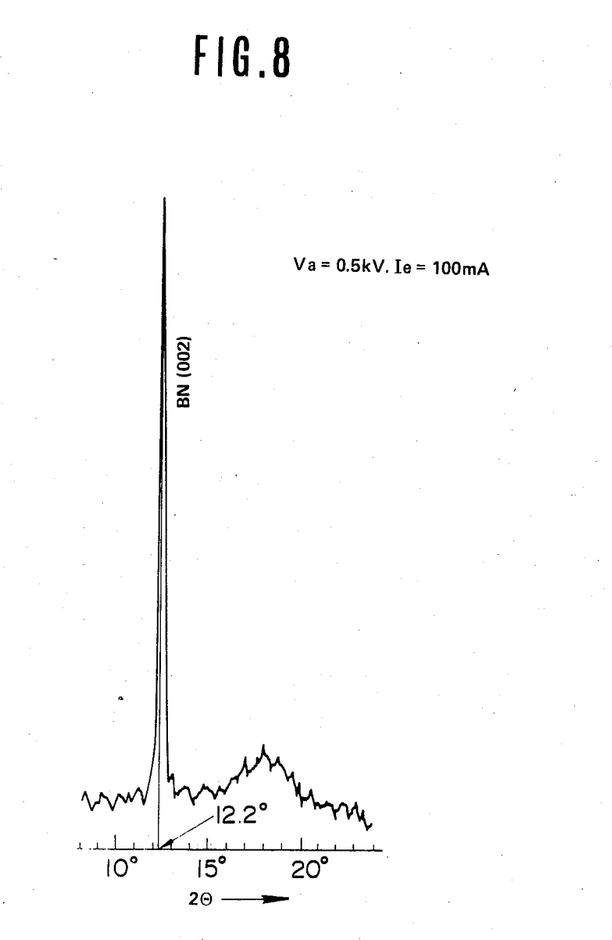
FIG. 8 is a graphical representation showing a result of X-ray diffraction analysis of a BN film formed on a monocrystalline Si semiconductor layer.

FIG. 8 shows a result of X-ray diffraction of a BN film formed on a substrate of a monocrystalline Si semiconductor layer in the substantially same manner as described above according to the ICB process under the conditions that acceleration voltage Va across an acceleration electrode and electronic current for ionization Ie are set at 0.5 kV and 100 mA, respectively, wherein the axis of abscissas indicates a reflection angle of X-ray (2θ)

As shown in FIG. 8, a strong reflection peak appears from the direction of the C-axis (002) of the BN film having a wurtzite structure at the position where the X-ray reflection angle (2θ) is 12.2°. This clearly indicates that the formed BN film is not amorphous but is preferentially orientated to the specified crystallographic axis along the C-axis (002).

Also, a result (not shown) of another X-ray diffraction on a BN film formed on an amorphous substrate of glass indicates that a BN film can be effectively formed due to preferential orientation to the C-axis (002) also on glass which is amorphous, although a reflection peak from the C-axis (002) is weak as compared with that of a BN film formed on the above-mentioned monocrystalline Si semiconductor layer under the same conditions.

Further, a misfit in lattice constant between the monocrystalline Si semiconductor layer and the BN film is as small as 5.9%. Thus, it will be noted that when Si is grown on the BN film preferentially orientated to the C-axis, it is substantially completely and readily epitaxially grown utilizing the crystallographic axis of the BN film as seeds of crystal growth to form a monocrystalline Si film sufficient to incorporate a semiconductor element thereinto.

The determination of infrared reflectance spectral characteristics of a BN film formed on a glass substrate (amorphous) under the same disposition conditions as in FIG. 8 shows the appearance of a peak due to a stretching vibration of the bond between nitrogen atom and boron atom at a wavenumber of 1380 cm$^{-1}$ as well as that due to a stretching vibration of the bond between oxygen atom and hydrogen atom or between nitrogen atom and hydrogen atom. The peak has a relatively small half band width. These facts clearly indicate the formation of a BN film of good quality from the viewpoint of crystallography although it somewhat contains hydrogen, oxygen or a combination thereof.

Figure 9:
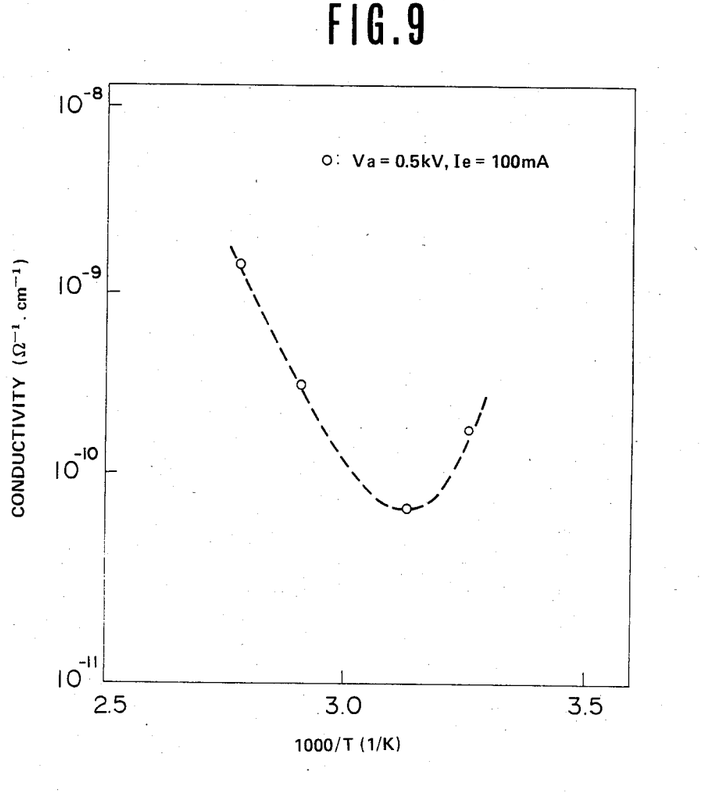
FIG. 9 is a graphical representation showing electrical conductivity of a BN film according to the present invention measured near a room temperature.

FIG. 9 shows electrical conductivity of a BN film measured near a room temperature (T=300 K.) which was formed on a substrate under the same deposition conditions as in FIG. 8, wherein the axis of abscissas indicates temperature (1000/T) and the axis of ordinates indicates conductivity.

As shown in FIG. 9, the BN film has an extremely low conductivity of about $10^{-9}\Omega^{-1}\cdot cm^{-1}$ to $10^{-11}\Omega^{-1}\cdot cm^{-1}$, and this clearly shows that it exhibits excellent electrical insulating properties. Accordingly, the use of such BN film in a manner to be interposed between layers of such an integration-settled semiconductor IC device as shown in FIGS. 2 to 7 permits the layers to be positively insulated from each other.

Further, thermal conductivity of a BN film of the C-axis preferential orientation formed on an amorphous substrate of glass under the same deposition conditions as in FIGS. 8 and 9 was measured utilizing a thermal pulse method. In the experiment, it was difficult to measure conductivity of the BN film itself because it is of the order of micron in thickness, however, the BN film deposited on the glass substrate was measured to have conductivity of 0.116 W/cm.deg in the areal direction or the direction perpendicular to the growth axis, which is substantially equal to conductivity of stainless steel. As described above, in the crystalline BN film, the conductivity along the growth axis is about three times as much as that in the direction perpendicular thereto.

Figure 10:
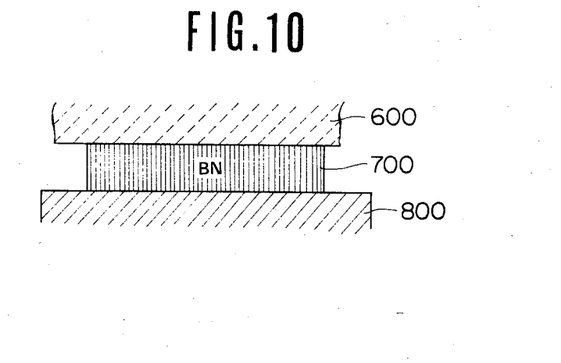
FIG. 10 is a schematic sectional view showing a further semiconductor device in which a BN film of the present invention is used as an insulating interlayer.

Accordingly, as shown in FIG. 10, when a semiconductor layer 100 is deposited thereon a BN film in such a manner to be orientated to a predetermined axis or the C-axis along the heat dissipation direction of the layer 100 as in the semiconductor device of FIG. 7 and further a heat dissipation plate 800 is formed on the BN film 700, heat dissipation is effectively carried out because heat generated by the semiconductor layer 600 is efficiently transmitted through the BN film 700 to the heat dissipation plate 800. This enhances the heat dissipation of a semiconductor device for large power such as a power transistor and realizes the integration and high density packaging of a semiconductor device.

The BN film and the process for preparing the same according to the present invention are not restricted to such specific forms as described hereinbefore. For example, a material to be charged in the crucible may be boron sulfide. Alternatively, $N_2$ gas or $NH_3$ gas may be used as a reactive gas to be introduced in the vacuum casing.

As can be seen from the foregoing, the BN film of the present invention is adapted to be formed in a manner to be preferentially orientated to a predetermined axis thereof on the surface of a substrate. The present BN film, when a substrate is crystalline such as a monocrystalline Si semiconductor layer, is epitaxially grown along the crystallographic axis of the layer, whereas, when a substrate is amorphous such as glass, it is grown along the C-axis (002).

Thus, the BN film according to the present invention is capable of serving as seeds for allowing a semiconductor layer to be epitaxially grown thereon, into which a semiconductor element is incorporated, and being used as an intermediate insulating layer for a three-dimensional semiconductor device and the like even in the form of a thin layer because of its high electrical insulating properties so that it may promote the high integration and high density packaging of a three-dimensional semiconductor device. Also, the BN film of the invention contributes to the manufacture of a semiconductor device because it can use inexpensive glass as a substrate.

In addition, in the BN film according to the present invention, the thermal conductivity along a predetermined axis thereof is about three times as much as a prior art amorphous BN film. Accordingly, the interposition of the present BN film between a semiconductor layer and a heat dissipation plate formed of metal or the like and acting as a heat sink provides an excellent heat dissipation capacity while keeping high electrical insulating properties. This effectively eliminates inconvenience such as insulation of the whole heat dissipation plate in a semiconductor device for large power generating a large amount of heat, to thereby carry out high density packaging of the semiconductor device.

Further, the positioning of the present BN film between a semiconductor layer and a heat dissipation plate in a semiconductor device to carry out heat conduction along, in particular, a predetermined axis or the C-axis of the BN film exhibits a more effective heat dissipation effect.

Furthermore, the process for preparing a BN film according to the present invention is practiced in a manner to heat and vaporize boride charged in a closed-type crucible having at least one injection nozzle, eject the vapor of boron through the nozzle into a nitrogen atmosphere below $10^{-2}$ Torr in pressure to ionize at least a part thereof, and impinge the ionized vapor on the surface of a substrate together with nitrogen. Thus, it facilitates the preparation of a BN film and the present process can form a BN film at a relatively low temperature so that a BN film easy to be handled may be formed which has a high adhesion with respect to a substrate and a good surface flatness and never adversely affects the impurity profile of a semiconductor element which has been already incorporated into a semiconductor device.

As many apparently widely different embodiments of this invention may be made without departing from the spirit and scope thereof, it is to be understood that the invention is not limited to the specific embodiments thereof except as defined in the appended claims.

What is claimed as new and desired to be secured by Letters Patent of the United States is:

1. A boron nitride film grown on the surface of a substrate by an ionized cluster beam deposition process to be orientated to a predetermined axis of said film, wherein said substrate is formed of an amorphous insulating material, said film being C-axis oriented on said substrate.

2. A boron nitride film as defined in claim 1, wherein ionized beam cluster deposition process comprises:
   heating boride charged in a closed-type crucible having at least one injection nozzle to form boron vapor;
   ejecting said boron vapor through said nozzle into a nitrogen atmosphere having a pressure below $10^{-2}$ Torr and ionizing at least a part thereof; and
   impinging said ionized boron vapor on the surface of said substrate together with nitrogen to form a boron nitride film on said substrate.

* * * * *